US012677429B2

(12) United States Patent
Ngwendson et al.

(10) Patent No.: US 12,677,429 B2
(45) Date of Patent: Jul. 7, 2026

(54) IGBT DEVICE

(71) Applicants:DYNEX SEMICONDUCTOR LIMITED, Lincoln (GB); ZHUZHOU CRRC TIMES SEMICONDUCTOR CO. LTD, Zhuzhou (CN)

(72) Inventors: Luther-King Ngwendson, Lincoln (GB); Ian Deviny, Lincoln (GB)

(73) Assignees: DYNEX SEMICONDUCTOR LIMITED, Lincolnshire (GB); ZHUZHOU CRRC TIMES SEMICONDUCTOR CO. LTD, Hunan (CN)

( * ) Notice: Subject to any disclaimer, the term of this patent is extended or adjusted under 35 U.S.C. 154(b) by 672 days.

(21) Appl. No.: 18/009,463

(22) PCT Filed: Sep. 15, 2021

(86) PCT No.: PCT/EP2021/075376
§ 371 (c)(1),
(2) Date: Dec. 9, 2022

(87) PCT Pub. No.: WO2023/041153
PCT Pub. Date:Mar. 23, 2023

(65) Prior Publication Data
US 2024/0222480 A1      Jul. 4, 2024

(51) Int. Cl.
H10D 12/00        (2025.01)
H10D 12/01        (2025.01)
(Continued)

(52) U.S. Cl.
CPC ......... H10D 12/481 (2025.01); H10D 12/038 (2025.01); H10D 62/393 (2025.01); H10P 50/283 (2026.01)

(58) Field of Classification Search
CPC .. H10D 12/031; H10D 12/032; H10D 12/035; H10D 12/038; H10D 12/411;
(Continued)

(56) References Cited

U.S. PATENT DOCUMENTS 7,449,354 B2 * 11/2008 Marchant ............. H10D 30/668
                                                             438/42
2006/0145230 A1      7/2006 Omura
(Continued)

FOREIGN PATENT DOCUMENTS

CN          102403346 A      4/2012
CN          111725311 A      9/2020
(Continued)

OTHER PUBLICATIONS

International Search Report and Written Opinion issued in connection with corresponding PCT Patent Application No. PCT/EP2021/075376 dated Jun. 20, 2022.
(Continued)

*Primary Examiner* — Natalia A Gondarenko
(74) *Attorney, Agent, or Firm* — Tarolli, Sundheim, Covell & Tummino LLP

(57)          ABSTRACT

We herein describe a gate controlled semiconductor device having a plurality of gate trenches, in which the plurality of gate trenches are laterally spaced from each other in a first dimension, current flows in a second dimension substantially transverse to the first dimension, and the plurality of gate trenches each extend in a third dimension of the device. A secondary trench extends in the first dimension of the device, and the secondary trench contacts each gate trench of the plurality of gate trenches at a plurality of intersection regions laterally spaced along the secondary trench.

14 Claims, 7 Drawing Sheets

(51) Int. Cl.

| | | |
|---|---|---|
| *H10D 62/17* | (2025.01) | |
| *H10P 50/28* | (2026.01) | |

(58) Field of Classification Search

CPC .. H10D 12/416; H10D 12/441; H10D 12/461; H10D 12/481; H10D 62/10; H10D 62/117; H10D 62/126; H10D 62/127; H10D 62/393; H10D 64/01; H10D 64/025; H10D 64/027; H10D 64/20; H10D 64/232; H10D 64/252; H10D 64/27; H10D 64/117; H10D 64/281; H10D 64/516; H10D 64/519; H10D 84/101; H10D 84/161; H10D 84/201; H10D 84/204; H10D 84/221; H01L 21/31111; H10P 50/20; H10P 50/24; H10P 50/262; H10P 50/263; H10P 50/264; H10P 50/267; H10P 50/28; H10P 50/282; H10P 50/283

USPC ......... 257/139, 301, 68, 302, 303, 304, 305, 257/329, 330, 331, 332, 333, 334, 383, 257/905

See application file for complete search history.

(56) References Cited

U.S. PATENT DOCUMENTS

| | | | |
|---|---|---|---|
| 2009/0085105 A1 | 4/2009 | Su et al. | |
| 2013/0056822 A1 | 3/2013 | Senoo | |
| 2013/0154000 A1 | 6/2013 | Shinbori | |
| 2016/0197171 A1 | 7/2016 | Onozawa | |
| 2017/0154970 A1* | 6/2017 | Burke | H10D 12/038 |
| 2018/0286943 A1 | 10/2018 | Naito | |
| 2019/0027472 A1 | 1/2019 | Konishi | |
| 2020/0091328 A1* | 3/2020 | Ngwendson | H10D 64/117 |

FOREIGN PATENT DOCUMENTS

| | | |
|---|---|---|
| JP | 2007324539 A | 12/2007 |
| WO | 20070117312 A2 | 10/2007 |

OTHER PUBLICATIONS

Office Action for CN application No. 202180042334.3, dated Dec. 23, 2025, 10 pages.

* cited by examiner

100

122

130

124

130

124

130

124

130

130

130

124

124

P well

N well

110

112

N-Base — 108

N Buffer — 106

P+ Collector — 104

IGBT DEVICE

TECHNICAL FIELD

The present disclosure relates to a semiconductor device, particularly but not exclusively, the present device relates to a gate controlled semiconductor device having a secondary trench connecting a plurality of gate trenches.

BACKGROUND

Power semiconductor devices, such as insulated gate bipolar transistors (IGBTs), are often used as switches as they operate in both on and off states. In the on-state a device can conduct high currents, and conduction losses are desired to be reduced. In the off-state a device can withstand the system maximum voltage with little or no current passing.

State-of-the-art IGBT devices, such as those shown in FIGS. 1 and 2, incorporate one or more busbars to reduce latency in gate voltage distributions around the chip. These include a gate polysilicon layer over an oxide layer, on top of a wide and deep p+ diffusion. Busbars generally have a width of around 60 μm, and the inclusion of these busbars reduces the active area for conduction. Furthermore, devices having a busbar are not suitable for use in presspack devices as the top area of the device is non-planar.

SUMMARY

Aspects and preferred features are set out in the accompanying claims.

According to a first aspect of the disclosure, there is provided a gate controlled semiconductor device comprising:
- a collector region of a first conductor type;
- a drift region of a second conductivity type located over the collector region;
- a body region of a first conductivity type located over the drift region;
- a first contact region of a second conductivity type located above the body region and having a higher doping concentration compared to the body region;
- a plurality of gate trenches extending from a surface into the drift region, wherein the at least one first contact region adjoins a gate trench such that, in use, a channel region is formed along said gate trench and within the body region, and
  - wherein the plurality of gate trenches are laterally spaced from each other in a first dimension, and wherein current flows in a second dimension substantially transverse to the first dimension, and wherein the plurality of gate trenches each extend in a third dimension of the device;
- a secondary trench extending from the surface into the drift region, wherein the secondary trench extends in the first dimension of the device, and wherein the secondary trench contacts each gate trench of the plurality of gate trenches at a plurality of intersection regions laterally spaced along the secondary trench.

The secondary trench reduces latency (RC time constant) of gate voltage distribution in the semiconductor device, and allows a device without a busbar to be used. Therefore, the current conduction area of the device is increased and the Vceon is reduced.

The secondary trench (also referred to as a bus trench) may comprise two vertical side walls and a bottom surface between the two vertical side walls; and an insulation layer along the vertical side walls and the bottom surface, wherein the insulation layer may have a thickness of 3000 Å to 5000 Å. More preferably, the insulation layer of the secondary trench may have a thickness of 3500 Å to 4500 Å, even more preferably the insulation layer of the secondary trench may have a thickness of 4000 Å. This insulation layer is referred to as a thick insulation layer. The thick insulation layer on the secondary trench eliminates capacitance effects. The thick insulation layer reduces degradation of the insulation layer, due to high electric fields in the region around the secondary trench.

The plurality of gate trenches may each comprise two vertical side walls and a bottom surface between the two vertical side walls and an insulation layer along the vertical side walls and the bottom surface. The secondary trench may comprise two vertical side walls and a bottom surface between the two vertical side walls and an insulation layer along the vertical side walls and the bottom surface. The insulation layer along one or more vertical side walls of the secondary trench may be thicker than the insulation layer along one or more vertical side walls of the gate trenches.

The insulation layer along the side walls of the plurality of gate trenches may be thicker in a region closer to the intersection regions than in a region distant from the intersection regions.

The insulation layer along at least one vertical side wall of at least one of the gate trenches may comprise two or more different thicknesses.

The device may further comprise at least one auxiliary trench extending from a surface into the drift region. The at least one auxiliary trench may be laterally spaced from the plurality of gate trenches in the first dimension, and the at least one auxiliary trench may extend in the third dimension of the device. The auxiliary trenches may be located between adjacent gate trenches. The auxiliary trenches prevent breakdown voltage degradation in the device.

The auxiliary trenches refer to trenches that do not have a MOS channel. The auxiliary trenches may be floating. Alternatively, the dummy (auxiliary) trenches may be connected to the emitter potential via an emitter metal contact. This disables capacitive coupling between the dummy and gate trenches. This leads to reduced $C_{GC}$ (gate collector capacitance), faster rate of turn-on dV/dt and dI/dt and reduced gate charge. This also means that during turnoff, there is faster capacitive discharge allowing Vce to rise faster towards the switching voltage.

The insulation layer along one vertical side wall of at least one gate trench may comprise two or more different thickness and the insulation layer along another vertical side wall of the said at least one gate trench may comprise a substantially constant thickness. Substantially constant thickness here may refer to an insulation layer having a thickness varying by 50% or less. In other words, at least one gate trench may have an asymmetrical insulation layer. The insulation layer having a substantially constant thickness may be located closer to the auxiliary trench such that the insulation layer may be thinner in the channel region and thicker on the side wall adjacent to the auxiliary trench.

Here the channel region refers to the metal-oxide semiconductor (MOS) conduction channel that can be inverted by application of a potential to the gate trench to allow passage of electrons. Here the insulation layer of the gate trench having different thicknesses generally means that a relatively thin insulation layer (or oxide) is present along the channel area and a relatively thick insulation layer (or oxide) is present along the remaining portion of the trench (e.g. near the bottom sidewalls and the along the bottom surface). In one example, the insulation layer along one sidewall has both thin and thick layers and the insulation layer along another sidewall has only a thick layer. Furthermore, the manufacturing process of the device enables the formation of trenches with two types of oxide configurations simultaneously, for example, symmetric and asymmetric thick oxide regions by the LOCOS technique.

The gate trenches may have a thick oxide layer or portion on vertical sidewall regions where conduction channels or accumulation layers are not formed. This reduces the gate collector capacitance ($C_{GC}$) and improves the switching speed. This reduces the turn on energy loss ($E_{ON}$) and the turn off energy loss ($E_{OFF}$). This thick oxide layer can be formed using of a technique/process called local oxidation of silicon (LOCOS). The gate trenches may not have a thin oxide layer on regions where electron conduction channels are formed. This improves the dynamic performance of the device.

The thickness of the insulation layer along a lower portion of a first vertical sidewall of the at least one gate trench may be greater than thickness of the insulation layer along an upper portion of a first vertical sidewall of the at least one gate trench, and the thickness of the insulation layer along a lower portion of a second vertical sidewall of the at least one gate trench may be the same as the thickness of an upper portion of a second vertical sidewall of the at least one gate trench. This configuration allows a thick oxide layer in regions where conduction channels are not formed, and a thin oxide layer in regions where there is no conduction channel.

The thickness of the insulation layer along the bottom surface of at least one gate trench may be the same as the thickness of the insulation layer along the lower portion of both vertical sidewalls. The vertical length of the lower portion may be greater than the vertical length of the upper portion of a vertical sidewall of the at least one active trench. The ratio of the vertical length of the lower portion and the vertical length of the upper portion may be equal to or greater than 1. This ratio may be adjusted to alter $C_{GC}$. In this way, the device performance can be adjusted.

The channel region may be formed along the insulation layer along the upper portion.

The device may not have a thick insulation layer formed in the region between trenches, known as the mesa region.

The device may be an insulated gate bipolar transistor (IGBT). Alternatively, the device could be a MOS controlled thyristor.

The device may have an absence of a busbar, such that a top surface of an active area of the device comprises a continuous, planar surface.

The auxiliary trench may comprises two vertical side walls and a bottom surface between the two vertical side walls and an insulation layer along the vertical side walls and the bottom surface. The insulation layer along one or more vertical side walls of the auxiliary trench may be thicker than the insulation layer along one or more vertical side walls of the gate trenches. The insulation layer along the two vertical sidewalls of the auxiliary trench may comprise a substantially constant thickness. The thick insulation layer on the auxiliary trenches eliminates capacitive coupling with the gate trench potential.

The device may be configured such that the auxiliary trench is biased at a ground potential. The device may further comprise a metal emitter contact. The metal emitter contact may be connected to the auxiliary trench. This connects the auxiliary trench to the emitter potential.

The device may further comprise a conductive layer on an upper surface of the secondary trench. The conductive layer may comprise a silicide, such as TiSix. The conductive layer may be located on the bus trench and on the surface of the intersection regions. The conductive layer reduces RC delay of the gate voltage signal. This improves the turnoff current capability and RBSOA (reverse bias safe operating area) of the device.

According to a further aspect of the disclosure, there is provided a method of manufacturing a gate controlled semiconductor device, the method comprising:

forming a collector region of a first conductor type;

forming a drift region of a second conductivity type located over the collector region;

forming a body region of a first conductivity type located over the drift region;

forming a first contact region of a second conductivity type located above the body region and having a higher doping concentration compared to the body region;

forming a plurality of gate trenches extending from a surface into the drift region, wherein the at least one first contact region adjoins a gate trench such that, in use, a channel region is formed along said gate trench and within the body region, and wherein the plurality of gate trenches are laterally spaced from each other in a first dimension, and wherein current flows in a second dimension substantially transverse to the first dimension, and wherein the plurality of gate trenches each extend in a third dimension of the device;

forming a secondary trench extending from the surface into the drift region, wherein the secondary trench extends in the first dimension of the device, and wherein the secondary trench contacts each gate trench of the plurality of gate trenches at a plurality of intersection regions laterally spaced along the secondary trench.

The plurality of gate trenches and the secondary trench may be manufactured using the steps of:

performing an etching process to form the plurality of gate trenches and the secondary trench;

forming a first insulation layer on a lower surface and side walls of the gate trenches and the secondary trench;

depositing a hydrophilic layer over the thick insulation layer;

depositing a photoresist material in the one or more trenches, wherein depositing a photoresist material comprises exposing the hydrophilic layer on an upper region of a first side wall of the gate trenches;

performing a wet etch process to etch the insulation layer on the first side wall of the gate trenches to a predetermined distance below the surface of the photoresist material;

removing the photoresist material;

removing the hydrophilic layer; and wherein after the steps of performing the wet etch process, removing the photoresist material, and removing the hydrophilic layer, the method further comprises forming a second insulation layer on the first side wall of the gate trenches, wherein the first insulation layer is thicker than the second insulation layer.

The first insulation layer may refer to a thick insulation layer and may have a thickness of 3000 Å to 5000 Å. More preferably, the thick insulation layer may have a thickness of 3500 Å to 4500 Å. More preferably, the thick insulation layer may have a thickness of 4000 Å. The second insulation layer may refer to a thin insulation layer and may have a thickness of 500 Å to 1800 Å. More preferably, the thin insulation may have a thickness of 800 Å to 1200 Å.

The hydrophilic layer means that the etchant, in the later step of performing a wet etch, uses capillary action to etch the insulation layer on the sidewalls, below the surface of the photoresist material. The capillary action etches down a channel between the hydrophilic layer and the material (for example, silicon) of the semiconductor device outside the trench. This also allows etching below the surface of the insulation layer, allowing deeper channels to be etched. Furthermore, this helps to achieve uniformity and consistency in both the etching process and the width and depth of the etched portion of the insulation layer. This also increases the controllability of the manufacturing process, in particular the width and depth of the etched portion.

The wet etch process, which etches down a channel along the sidewall of the trench, facilitates the manufacture of devices having trenches with asymmetric or symmetric trench gate regions, having two different insulation layer thicknesses on a sidewall of a trench.

This allows the manufacture of a device having a gate trench with a uniform thin insulation layer, asymmetric, or symmetric insulation layer of different thickness, and a bus trench with a uniform thick insulation layer.

The hydrophilic layer may comprise nitride. The hydrophilic layer may comprise $Si_xN_y$ (silicon nitride) or another material with good wettability or a high degree of wetting. The wettability modulates etch rate down trench side-walls, and enables uniformity of etch distance and repeatability of the process. If wettability is not sufficient, some areas will etch faster than others down the trench walls by the capillary action. A material with high degree of wetting improves the capillary action that etches down a channel. The wettability property of the hydrophilic layer allows accurate control of etch depth and ensures uniformity of the etch process down the etched channel.

Forming the first insulation layer may comprise thermally growing a thick oxide layer using a local oxidation of silicon process. Alternatively, forming the first insulation layer may comprise depositing a thick oxide layer. Depositing a thick oxide layer may be carried out using Tetraethyl Orthosilicate (TEOS) deposition. TEOS deposition is very conformal.

Forming the second insulation layer may comprise thermally growing a thin oxide layer at 900° ° C. to 1100° C.

The method may further comprise depositing a filling material after forming the second insulation layer.

The method may further comprise depositing a silicide layer over the secondary trench after depositing the filling material.

The method may comprise manufacturing one or more gate trenches with an asymmetric insulation layer.

The method may comprise manufacturing one or more gate trenches with a symmetric insulation layer. Depositing a photoresist material may comprise exposing the hydrophilic layer on an upper region of two sides of the one or more gate trenches. The method may further comprise performing a wet etch process to etch the insulation layer on two side walls of the gate trenches to a predetermined distance below a surface of the photoresist material, and growing the first insulation layer on the two side walls of the gate trenches.

The method may comprise manufacturing at least two gate trenches each with an insulation layer wherein a first trench of the at least two gate trenches is separated from a second trench of the at least two gate trenches by a mesa region between the first and second trenches and wherein depositing a photoresist material may comprise exposing the hydrophilic layer in the mesa region between the first and second trenches. The first side of the first trench is adjacent to the first side of the second trench.

The method may further comprise removing the hydrophilic layer in the mesa region between the first and second trenches. This allows the thick oxide in the mesa region to be removed by etching, as the thick oxide in the mesa region is therefore not protected by the hydrophilic layer. This also removes the hydrophilic layer above the thick oxide on the trench sidewall so that the thick oxide on the sidewall can be etched.

BRIEF DESCRIPTION OF THE DRAWINGS

Some preferred embodiments of the disclosure will now be described, by way of example only and with reference to the accompanying drawings, in which:

FIG. 9 shows a cross-section of the trenches of the device of FIG. 8;

FIG. 10 shows a cross-section of a trench according to a further embodiment of the disclosure; and FIGS. 11(a) to 11(g) illustrate steps of manufacturing trenches of an IGBT device, according to an embodiment of the disclosure.

DETAILED DESCRIPTION OF THE PREFERRED EMBODIMENTS

Figure 1:
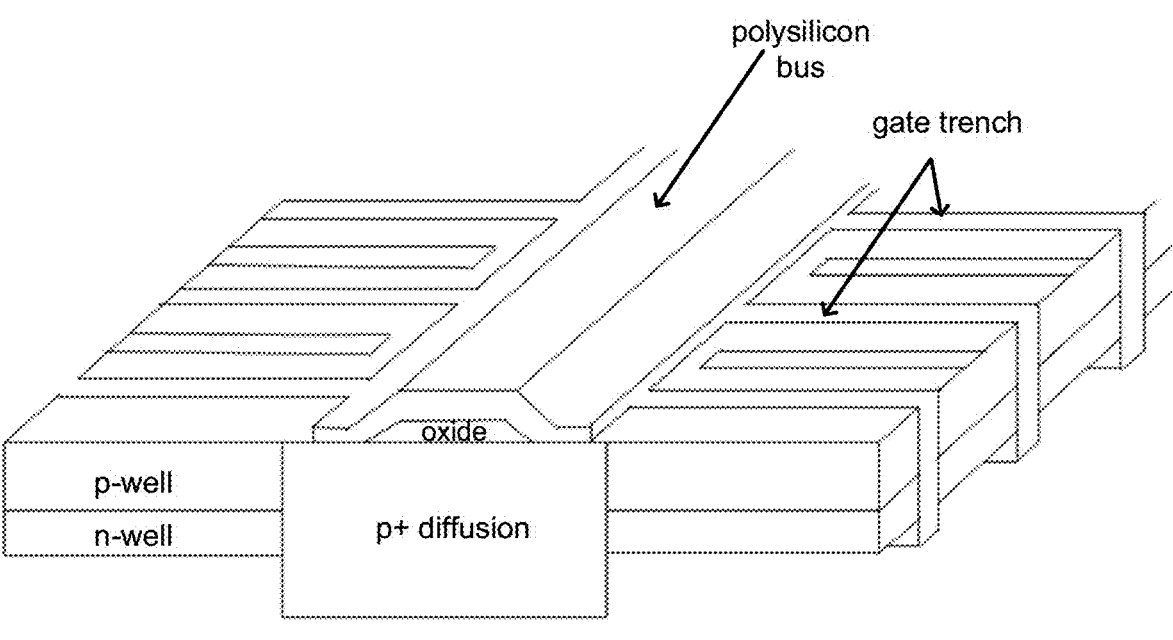
FIG. 1 illustrates a conventional trench IGBT device having a busbar.
Figure 2:
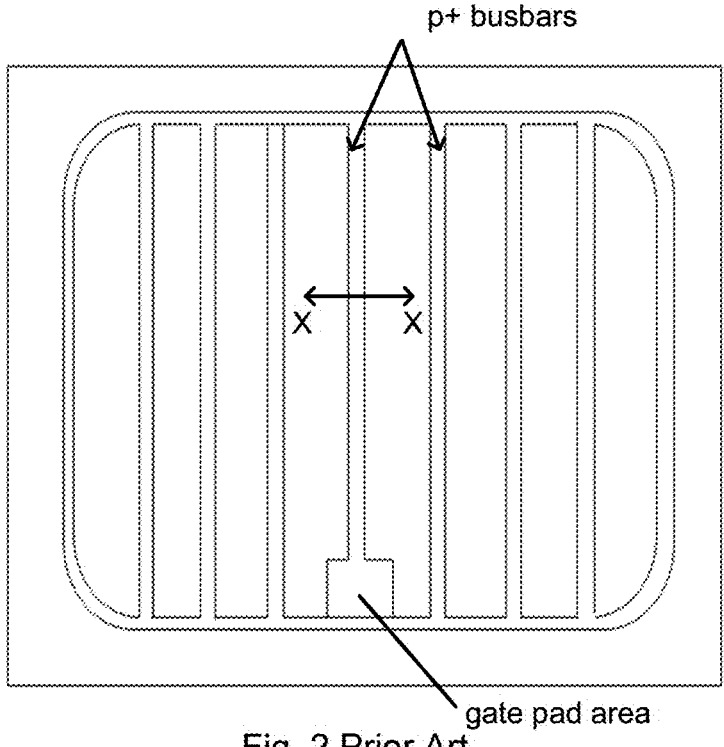
FIG. 2 shows a top view of the device of FIG. 1.
Figures 3, 4:
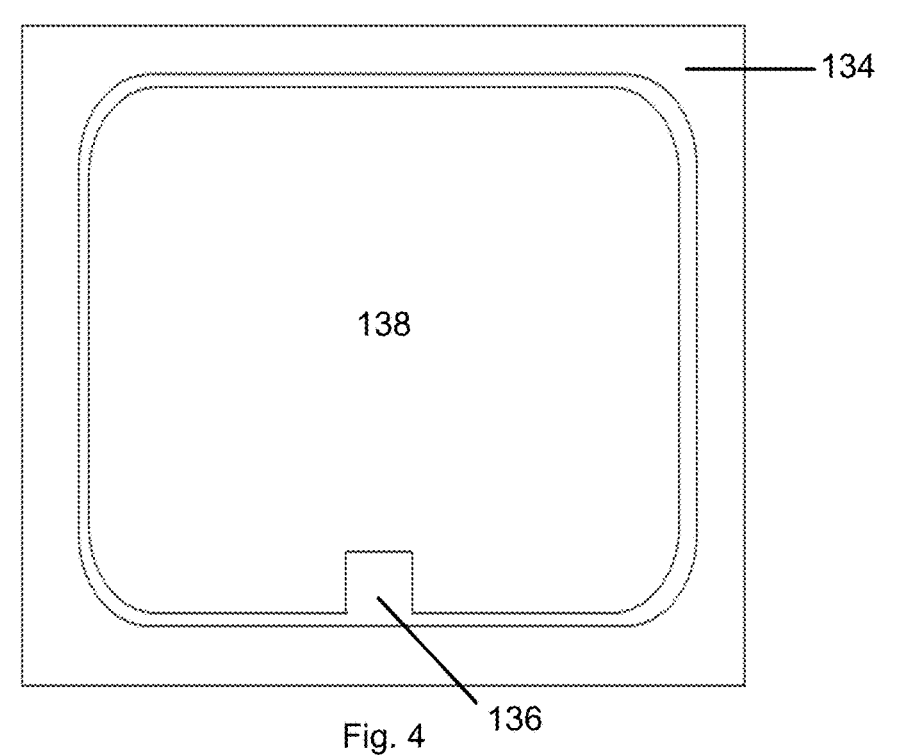
FIG. 3 illustrates a perspective view of a trench IGBT device according to an embodiment of the disclosure.
FIG. 4 illustrates a top view of the device of FIG. 3.

FIG. 3 illustrates a perspective view of a trench IGBT device according to an embodiment of the disclosure. In this embodiment, the device 100 includes an n-type voltage sustaining region or n-base (or a drift region) 108 over a collector p+ layer (substrate) 104. The collector p+ layer 104 is, for example, a p-type diffusion on the backside that supplies holes in the on-state for bipolar conduction. An n buffer layer 106 is located between the p+ collector layer 104 and the n-base region 108.

The device 100 includes gate trenches 124 extending down into the n-base 108 from the surface of an n+ contact region (or a first contact region) 116. A MOS channel is formed along the gate trenches 124 in an on-state by application of a positive voltage. Above the n-base 108 and adjacent to the active trench 124, there is provided a p-well or p-body (or a body region) 112. Underneath the p-base (p-well layer) 112, and in contact with both the p-base 112 and the n-base layer 108, there is an n-well layer 110. This n-well layer 110 acts as a charge storage (CS) layer. The n-well layer 110 lowers the on-state conduction loss or Vce(sat). The n-well layer 110 extends throughout the entire width of the device.

Figure 6:
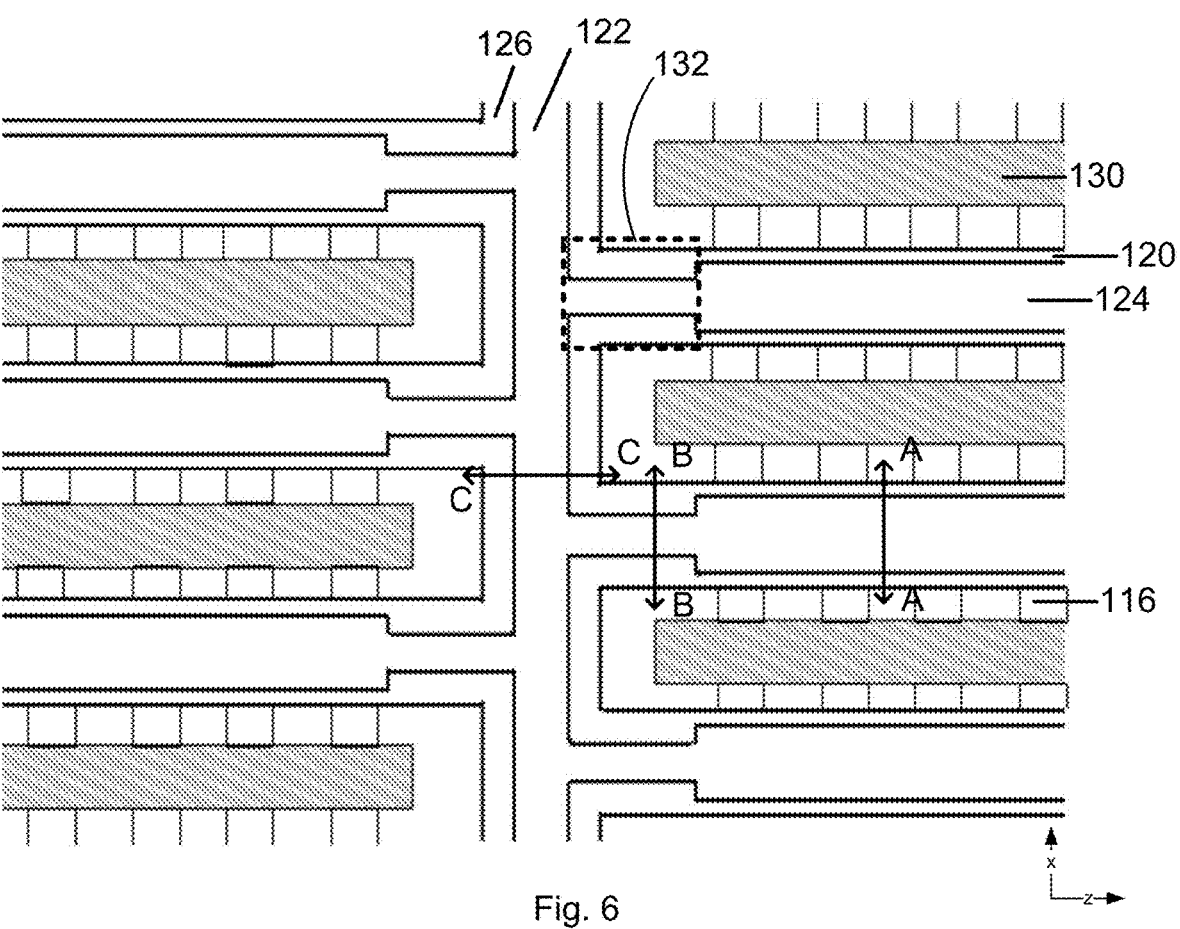
FIG. 6 shows a top view of a cross section through the device of FIG. 3.

Within the p-base or p-body region 112, the n+ region 116 of the emitter (as shown in FIG. 6) is formed. An emitter p+ contact layer (or the second contact region) is formed above the p-base (p-well layer) 112. An emitter metal contact 130 is located over the surface of the device, and contacts the n+ contact region 116 and the p+ contact region. The p+ contact region (not shown) is located under the emitter contact 130.

From this figure, it can be seen that the gate trenches 124 are spaced from each other in a first dimension x. Current flows in the device in a second dimension y, and each gate trench extends in the device 100 in a third dimension z.

The device also includes a secondary trench (also referred to as a bus trench) 122. The bus trench 122 extends in the first dimension of the device x and intersects the gate trenches 124 at a plurality of intersection regions (shown in FIG. 6) along the bus trench 122. The bus trench 122 and the gate trenches 124 therefore form a larger, continuous trench structure.

The bus trench 122 prevents the gate trenches from extending completely across the IGBT device, thereby improving the distribution of the gate signal. This allows individual cells in the device to turn on at the same time. The bus trench 122 allows for a device without a busbar to be manufactured. This improves planarity of the device such that the device is suitable as a presspack IGBT device. Gate voltage conduction within the active area of the device by the bus trench 122 having a thick oxide insulation layer eliminates capacitance effects.

As there is no busbar, no p+ diffusion is required thereby increasing the conduction area of the device and reducing on-state voltage drop.

FIG. 4 illustrates a top view of the device of FIG. 3. In comparison to the state-of-the-art device, the top surface of the active conduction area 138 is planar as the device has no busbars, forming a continuous flat surface surrounded by the gate pad area 136 and the edge termination 134.

Figure 5:
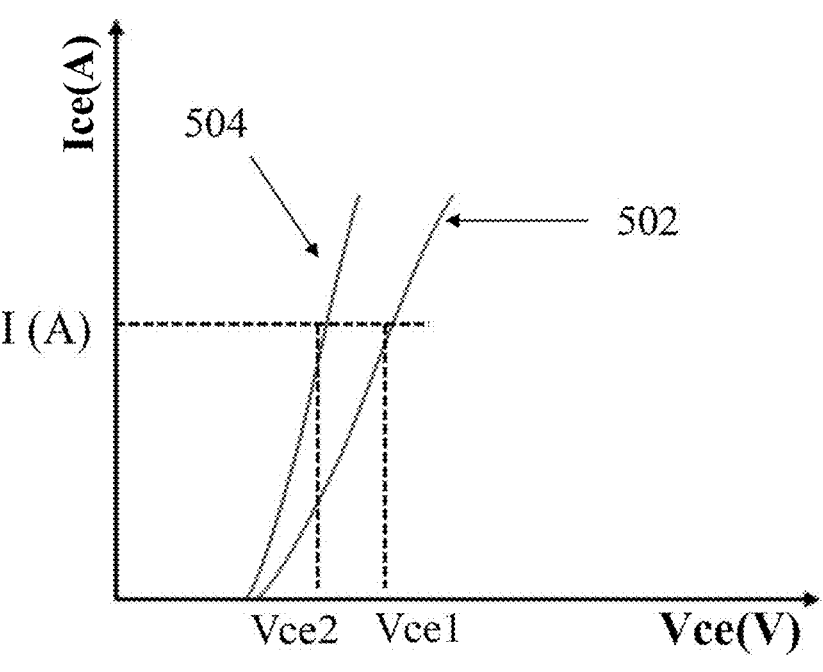
FIG. 5 shows saturation voltage against conduction current for a conventional device and an IGBT device according to an embodiment of the disclosure.

FIG. 5 shows saturation voltage Vce(V) against conduction current Ice(A) for a conventional device 502 and an IGBT device according to an embodiment of the disclosure 504. This shows that an IGBT device according to an embodiment of the disclosure has a lower saturation voltage Vce2 for a given conduction current I(A) and chip dimension than the saturation voltage Vce1 of convention IGBT devices having a busbar.

FIG. 6 shows a top view of a cross section through the device of FIG. 3. The gate trenches 124 are spaced from each other in a first dimension x and extend in the device 100 in a third dimension z. The bus trench 122 extends in the first dimension x, and the gate trenches join the bus trench at intersection regions 132.

Between adjacent gate trenches 124, the device has an emitter contact 130 that is in contact with a plurality of n+ contact regions 116.

Figure 7:
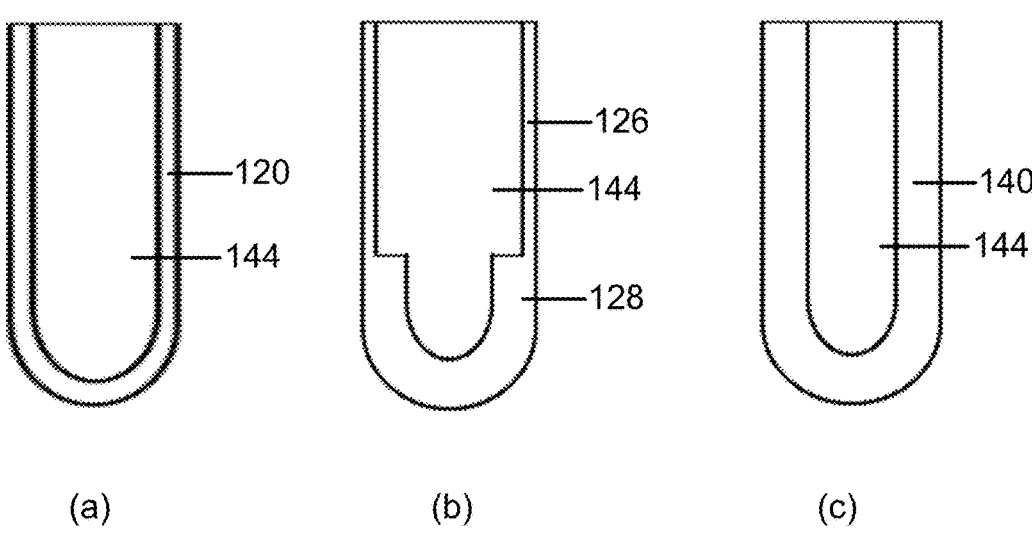
FIG. 7 illustrates a cross-section of the trenches of the device of FIG. 3.

Each trench 122, 124 includes vertical side walls and a bottom surface between the vertical side walls (as shown in FIG. 7). The trenches 122, 124 can be doped polysilicon trenches with an oxide region on the side walls. As shown in FIG. 6, the side walls of the gate trenches have a thinner oxide layer 120 than the oxide layer 126 on the side walls of the bus trench 122 and the intersection region 132. The use of trenches, having a thick oxide insulation layer, to distribute the gate voltage improves the active area of the device that can be used for current conduction. The bus trench has a width between 1.5 μm and 4 μm. In some examples, this increases the active area by 10-15% compared to devices having a busbar. Therefore the VCEON for a given chip size is decreased.

FIG. 7(a) illustrates a cross-section of an example gate trench, FIG. 7(b) illustrates a cross-section of an alternative gate trench, and FIG. 7(c) illustrates a cross-section of the intersection region or the bus trench of the device of FIG. 3. Each trench includes two vertical side walls and a bottom surface between the vertical side walls.

FIGS. 7(a) and 7(b) illustrate cross-sections across the cut-line A-A of FIG. 3. FIG. 7(a) illustrates a first embodiment in which the gate trench 124 has a uniform thin oxide layer 120 on the vertical side walls. Thin oxide layer refers to a layer having a thickness between 500 Å and 1800 Å. The trenches are filled with polysilicon 144. This gate trench with uniform thin oxide provides a high gate capacitance.

Alternatively, the gate trench 124 can have an oxide layer having two thicknesses as shown in FIG. 7(b). One portion of the oxide layer has a greater thickness compared to another portion of the same oxide layer. The oxide layer with the greater thickness is referred to as a thick oxide layer 126 and the oxide layer of the same trench having a smaller thickness is referred to as a thin oxide layer 128. Thick oxide refers to an oxide insulation layer having a thickness between 3000 Å to 5000 Å. The same definitions apply to all the embodiments of the specification. The thick oxide layer 126 is generally located along the bottom surface and low sides (or lower portion of the vertical side walls) of the gate trenches 124. The thin oxide layer 128 is generally located along the conduction channel region (which is located along the upper portion of the vertical side walls of the gate trench) of the device. The feature of trenches with a thick bottom oxide 126 improves immunity to high electric field stress and harnesses the device breakdown voltage. The gate capacitance reduces with increased thickness of the oxide layer. This gate trench with a thick oxide layer on the bottom of the trench provides a low gate capacitance.

In FIG. 7(b), the gate trench 124 has the thin oxide layer 128 on the vertical side wall regions where electron conduction channels are formed. The active trenches 124 have a thick oxide layer or portion 126 on vertical side wall regions where conduction channels or accumulation layers are not formed. This reduces the gate collector capacitance ($C_{GC}$) and improves the switching speed. This lowers or reduces the turn on energy loss ($E_{ON}$) and the turn off energy loss ($E_{OFF}$).

The active trenches 124 are formed of (or may have) an upper portion and a lower portion. The upper portion extends for a length y1 downwards from the surface of the trench. The lower portion extends for a length y2 upwards from the bottom of the trench. On trench side walls without a thick oxide layer on the upper portion, the transition from the thin oxide 128 to the thick oxide 126 on the vertical side walls of the trenches occurs at the boundary between the upper and lower portions. The transition occurs at a distance y1 from the top of the active trenches. The distance from the bottom of the active trenches to the transition from the thin oxide 128 to the thick oxide 126 is given by y2, in which generally y1/y2>1 and adjusting this ratio alters the $C_{GC}$. In this way, y1 and y2 can be adjusted to tune the device performance. The values of y1 and y2 may vary for different trenches within the same device. y2 may be greater than 0.5 μm. y1 can be as large as the depth of the p-well region.

All the gate trenches in a device may each have a uniform thin oxide layer as shown in FIG. 7(a), or may all have an insulation layer having two thicknesses as shown in FIG. 7(b). Alternatively, an IGBT device may have gate trenches similar to those in both FIG. 7(a) and FIG. 7(b).

FIG. 7(c) illustrates cross-sections across the cut-lines B-B and C-C of FIG. 3. This shows the bus trench and the intersection region have a uniform thick oxide layer 140. The thick oxide layer on the bus trench and intersection regions means that the bus trench and intersection regions can withstand a higher electric field strength. This prevents breakdown voltage degradation and improves oxide reliability under extreme RBSOA switching.

Figure 8:
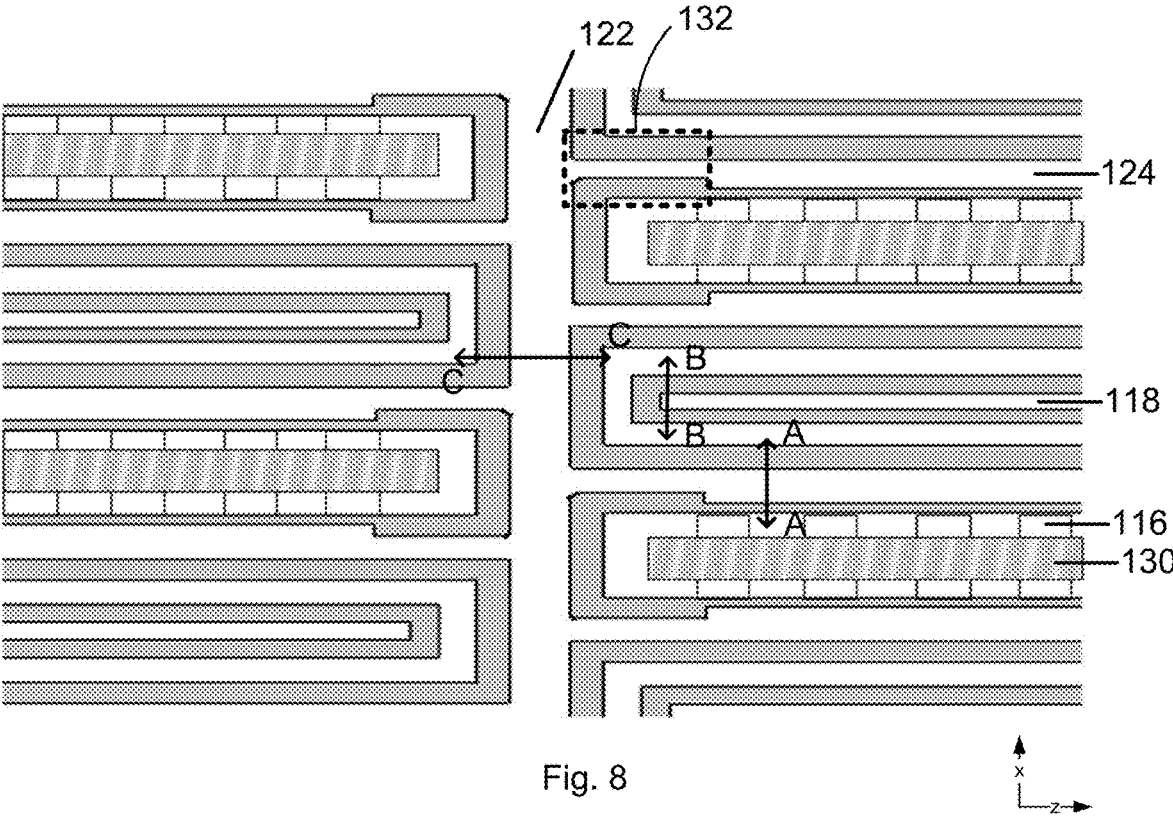
FIG. 8 shows a top view of a cross section through an alternative trench IGBT device according to a further embodiment of the disclosure.

FIG. 8 shows a top view of a cross section through an alternative trench IGBT device according to a further embodiment of the disclosure. In this embodiment, auxiliary or dummy trenches 118 are located between adjacent gate trenches 124. The dummy trenches 118 are laterally spaced from each other and from the gate trenches 124 in the first dimension x and extend in the device 100 in a third dimension z. The bus trench 122 extends in the first dimension x, and the gate trenches 124 join the bus trench 122 at intersection regions 132, however the dummy trenches 118 are isolated from the bus trench 122. The dummy trenches 118 control breakdown voltage degradation for wide cell pitch designs, allowing gate trenches to be further apart without lowering the breakdown voltage.

Figures 9, 10, 11A, 11B:
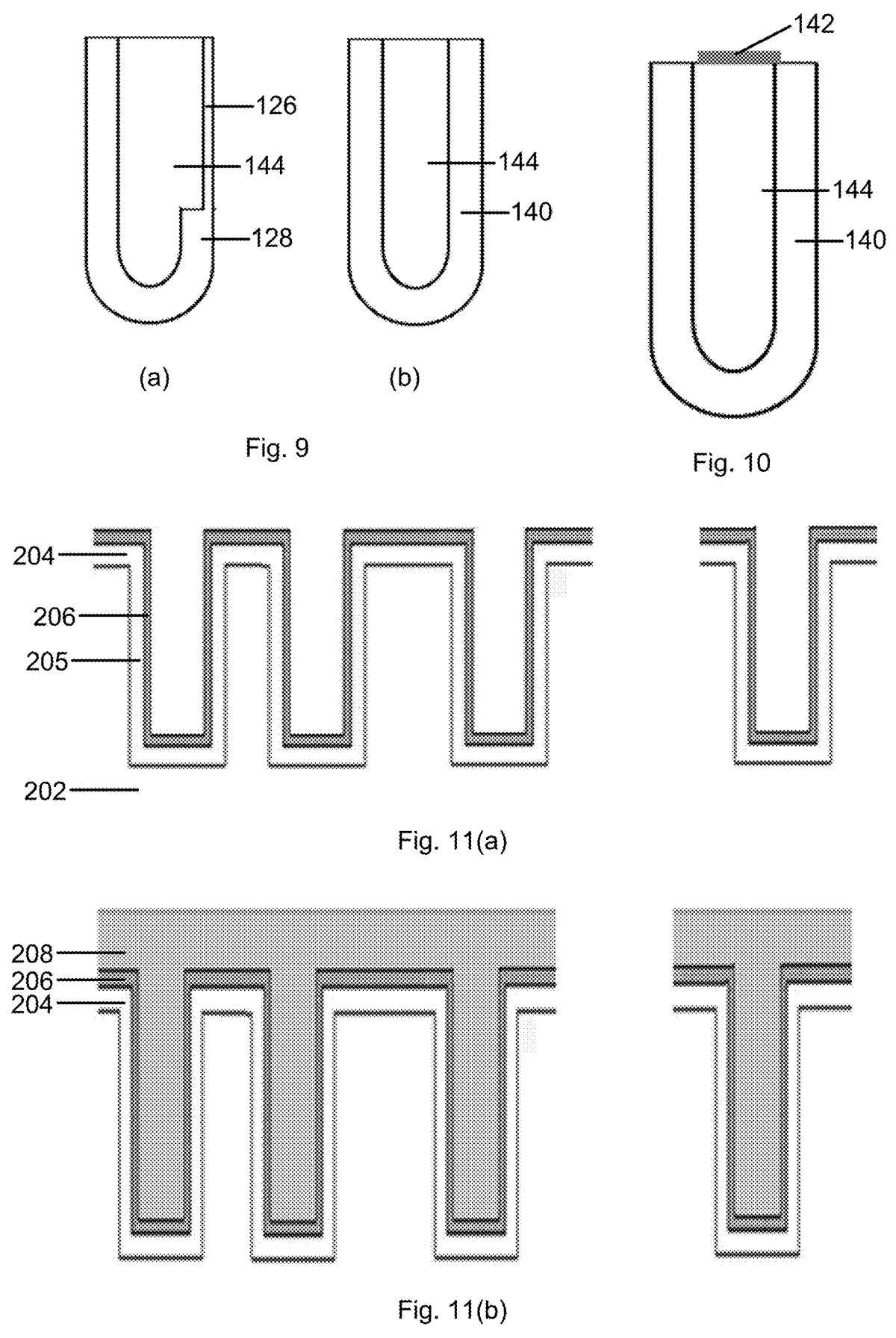

Each trench 118, 122, 124 includes vertical side walls and a bottom surface between the vertical side walls (as shown in FIG. 9). The trenches 118, 122, 124 can be doped polysilicon trenches with an oxide region on the side walls. As shown in FIG. 8, the side walls of the gate trenches have a thinner oxide layer 120 on the side wall closest to the emitter contact 130 than the oxide layer 126 on the side walls of the bus trench 122, the intersection region 132, and the dummy trenches 188. The thick oxide on the dummy trenches 122 eliminates capacitive coupling with the active gate potential. The capacitance of a trench reduces with increasing oxide thickness, and parallel capacitances are coupled together. Dummy trenches with thick oxide have very low capacitance, so coupling is largely eliminated.

FIG. 9(a) illustrates a cross-section of an example gate trench and FIG. 9(b) illustrates a cross-section a cross-section of the intersection region, the bus trench, or a dummy trench of the device of FIG. 8. Each trench includes two vertical side walls and a bottom surface between the vertical side walls.

FIG. 9(a) illustrates a cross-section across the cut-line A-A of FIG. 8. The gate trench 124 has an oxide layer having two thicknesses. One portion of the oxide layer has a greater thickness compared to another portion of the same oxide layer. The oxide layer with the greater thickness is referred to as a thick oxide layer 126 and the oxide layer of the same trench having a smaller thickness is referred to as a thin oxide layer 128. The thick oxide layer 126 is generally located along the bottom surface and low sides (or lower portion of the vertical side walls) of the gate trenches 124. The thin oxide layer 128 is generally located along the conduction channel region (which is located along the upper portion of the vertical side walls of the gate trench) of the device, on the side of the active trenches 124 closest to the n+ contact region 116 and p+ contact region 114. The feature of trenches with a thick bottom oxide 126 improves immunity to high electric field stress and harnesses the device breakdown voltage.

The active trenches 124 have two side walls, and the conduction channel is formed along only one side wall and no conduction channel is formed along another side wall. The active trenches 124 have a thick oxide layer (or an oxide layer having a constant thickness) along a complete vertical side wall of the trench, where the conduction channel is not formed. The active trenches 124 have a thick oxide layer 126 formed on the bottom surface and low side walls (of the trench), and a thin oxide layer 128 on the upper side walls where a conduction channel is formed. This reduces the gate collector capacitance ($C_{GC}$) and improves the switching speed. This lowers or reduces the turn on energy loss ($E_{ON}$) and the turn off energy loss ($E_{OFF}$).

FIG. 9(b) illustrates cross-sections across the cut-lines B-B and C-C of FIG. 8. This shows the bus trench, the intersection region, and the dummy trenches have a uniform thick oxide layer 140.

FIG. 10 shows a cross-section of a trench according to a further embodiment of the disclosure, in which a silicide layer 142 is formed over the bus trench. This can be formed over the bus trench and/or the intersection regions of the IGBT device. The silicide layer 142 may be a TiSix layer. The conductive layer, in this example a silicide layer 144, enhances conductivity and reduces the resistive-capacitive (RC) delay of the gate voltage signal. This results in improved turnoff current capability and/or reverse bias safe operating area (RBSOA) of the device. The conductive layer 144 may be formed on selective trench surfaces after the planarization of the polysilicon within the trenches (shown in FIG. 11(g)).

FIGS. 11(a) to 11(g) illustrate steps of manufacturing trenches of an IGBT device, according to an embodiment of the disclosure. This shows the steps for simultaneously manufacturing at least one gate trench having an asymmetric insulation layer (or a thin insulation layer) and a bus trench having a uniform thick oxide layer. This method can also be used to manufacture at least one dummy trench.

FIG. 11(a) illustrates the first set of steps of manufacturing the trenches of the IGBT device, which is as follows:

An oxide layer 204 is deposited on a silicon substrate 202.

Photolithography and then a dry etch step using plasma source to form trenches to desired depth in the silicon substrate 202. In this embodiment, the desired depth z of the trenches is 4 μm to 6 μm.

A thick oxide layer 205 is thermally grown or deposited on the sidewalls and bottom surface of the trenches. The thick oxide layer 205 may be deposited using TEOS. The thick oxide layer 205 has a thickness of approximately 3000 Å to 5000 Å.

A hydrophilic layer 206 such as nitride is deposited over the oxide layer 204, 205. The nitride layer 206 has a thickness of approximately 1300 Å to 2500 Å.

Figures 11C, 11D, 11E:
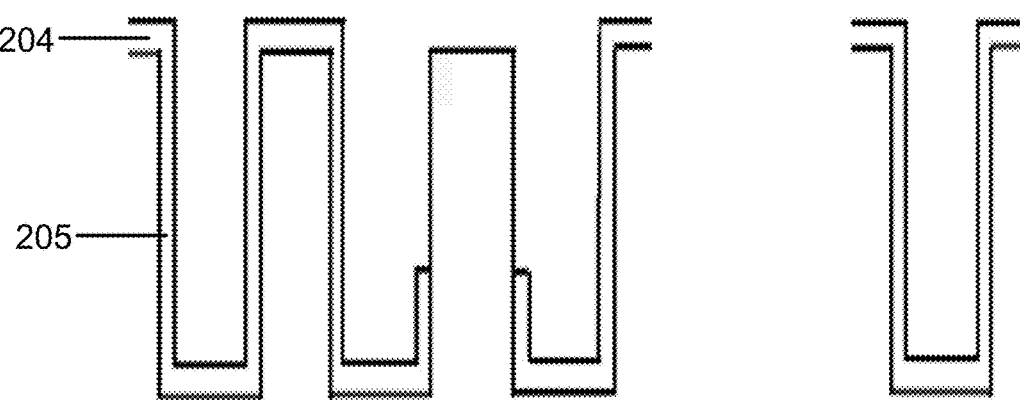

FIGS. 11(b) and 11(c) illustrate the second and third sets of steps of manufacturing the trenches of the IGBT device, which is as follows:

The trenches are filled with a photoresist material 208.

The photoresist 208 is deposited such that the hydrophilic layer 206 is exposed on a first side of each gate trench for which asymmetric oxide will be manufactured, is exposed in the mesa region between trenches having thin oxide or asymmetric oxide, and is exposed on both sides of a gate trench having uniform thin oxide. The hydrophilic layer 206 over the dummy trenches and the bus trench is not exposed.

The first side of each gate trench (the side where the hydrophilic layer 206 is exposed) is the upper portion of one side of the trench that will be manufactured to have a thin oxide layer, whilst the side of each trench that will be manufactured to have thick oxide, remains covered by the photoresist.

An etch process is performed on the exposed hydrophilic layer 206 over the mesa region. The etch process can be a wet or dry etch, and stops on the oxide layer 204 in the mesa region.

In embodiments where the hydrophilic layer 206 is nitride, the etch process may be done in plasma ambient (an atmosphere or environment of plasma, created by a mixture of gases) using $CF_4/HBr$ chemistry.

FIG. 11(d) illustrates the fourth set of steps of manufacturing the trenches of the IGBT device, which is as follows:

The whole wafer is immersed in a BOE (buffered oxide etch) such as 7:1 HF. The buffered oxide etchant etches the oxide layer 204 on the exposed mesa region and the oxide layer 205 on the trench sidewalls extending down from the exposed mesa region to a desired depth Z below the surface of the trench. Z is a function of etch time.

The hydrophilic layer 206 creates a capillary action so that the etchant etches the oxide layer 204 along the narrow channel between the hydrophilic layer itself 206 and the silicon 202.

The presence of the hydrophilic layer 206 allows control of the etch depth and uniformity of the etch process. The hydrophilic layer 206 reduces defects formed during the etch process.

The photoresist is stripped (removed) using any suitable wet (such as hot phosphoric acid) or dry (such as a mixture of CF4 and HBr gases in a plasma etch chamber) chemistry.

FIG. 11(e) illustrates the fifth set of steps of manufacturing the trenches of the IGBT device, which is as follows:

The hydrophilic layer is stripped (removed) using any suitable wet or dry chemistry. This leaves the trenches having only oxide 205 on regions not exposed in the earlier steps.

Figures 11F, 11G:
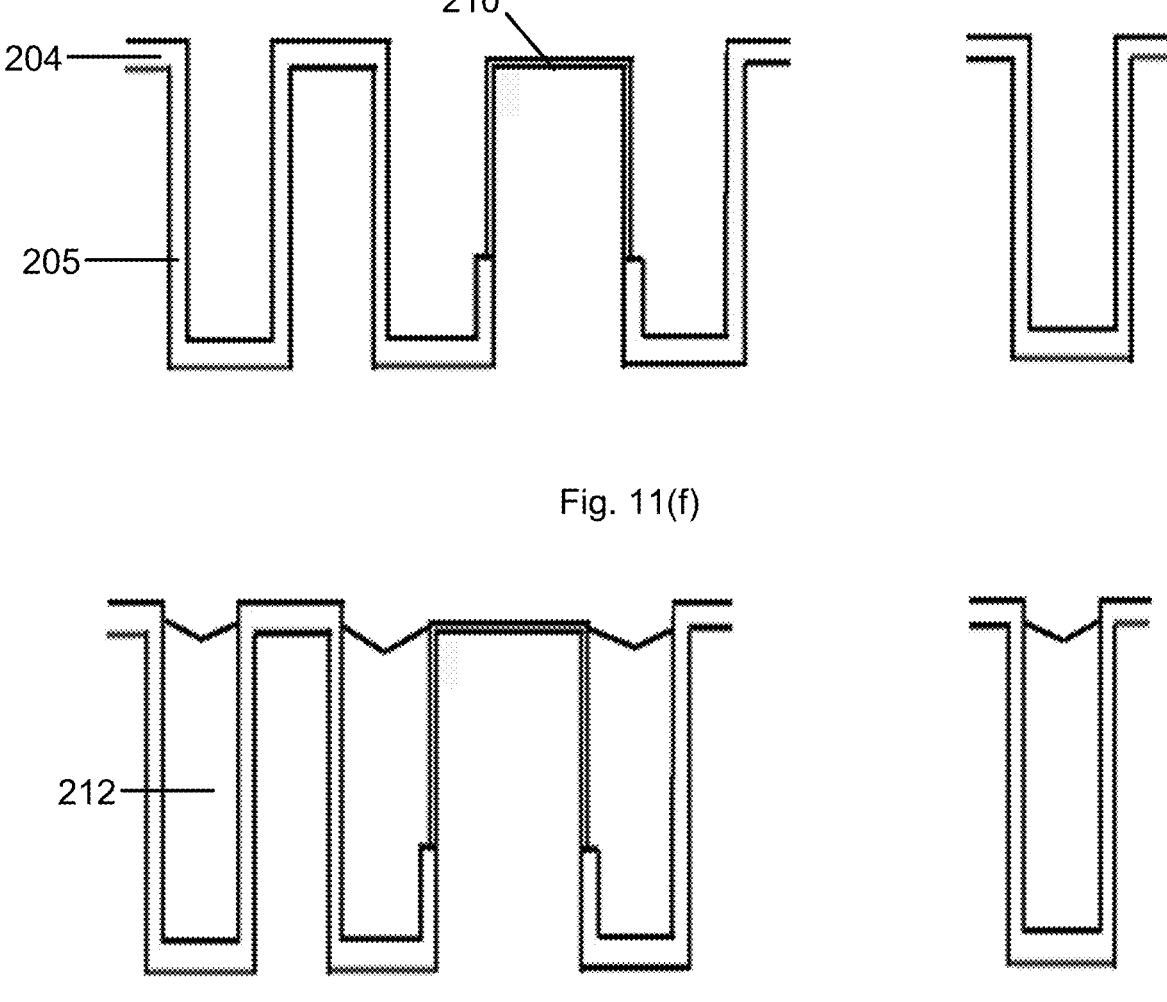

FIG. 11(f) illustrates the sixth set of steps of manufacturing the trenches of the IGBT device, which is as follows:

A thin oxide layer 210 is grown on the exposed silicon in a furnace step at 900° ° C. to 1100° C. The thin oxide layer grows on the first side of each trench in which the hydrophilic layer was exposed in FIG. 11(c), and in the mesa region between the trenches.

The thin oxide layer has thickness of approximately 500 Å to 1800 Å.

FIG. 11(g) illustrates the seventh set of steps of manufacturing the trenches of the IGBT device, which is as follows:

Polysilicon 212 is deposited to fill the trenches. The polysilicon 212 is planarised by etching the top of the polysilicon 212 to level off with the silicon 202 in the mesa region between the trenches

| List of Reference Numerals |
| --- |
| 100 IGBT Device |
| 104 Collector layer |
| 106 Buffer layer |
| 108 Drift region |
| 110 n-well layer |
| 112 p-well layer |
| 116 n+ region |
| 118 Dummy trench |
| 120 Uniform thin oxide layer |
| 122 Bus trench |
| 124 Gate trench |
| 126 Thin oxide layer |
| 128 Thick oxide layer |
| 130 Emitter contact |
| 132 Intersection regions |
| 134 Edge termination |
| 136 Gate pad area |
| 138 Active area |
| 140 Uniform thick oxide layer |
| 142 Silicide layer |
| 144 Polysilicon |

-continued

| List of Reference Numerals |
| --- |
| 202 Silicon substrate |
| 204 Thick oxide layer |
| 205 Thick oxide layer |
| 206 Hydrophilic layer |
| 208 Photoresist material |
| 210 Thin oxide layer |
| 212 Polysilicon |

The skilled person will understand that in the preceding description and appended claims, positional terms such as 'above', 'overlap', 'under', 'lateral' etc. are made with reference to conceptual illustrations of an apparatus, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

It will be appreciated that all doping polarities mentioned above could be reversed, the resulting devices still being in accordance with embodiments of the present invention.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A gate controlled semiconductor device comprising:
a collector region of a first conductivity type;
a drift region of a second conductivity type located over the collector region;
a body region of the first conductivity type located over the drift region;
a first contact region of the second conductivity type located above the body region and having a higher doping concentration compared to the body region;
a plurality of gate trenches extending from a surface into the drift region, wherein the at least one first contact region adjoins a gate trench such that, in use, a channel region is formed along said gate trench and within the body region, and
wherein the plurality of gate trenches are laterally spaced from each other in a first dimension, and wherein current flows in a second dimension substantially transverse to the first dimension, and wherein the plurality of gate trenches each extend in a third dimension of the device; and
a secondary trench extending from the surface into the drift region, wherein the secondary trench extends in the first dimension of the device, and wherein the secondary trench contacts each gate trench of the plurality of gate trenches at a plurality of intersection regions laterally spaced along the secondary trench;
wherein the plurality of gate trenches each comprise:
two vertical side walls and a bottom surface between the two vertical side walls; and
an insulation layer along the vertical side walls and the bottom surface;

wherein the secondary trench comprises:

two vertical side walls and a bottom surface between the two vertical side walls; and an insulation layer along the vertical side walls and the bottom surface;

wherein the insulation layer along one or more vertical side walls of the secondary trench is thicker than the insulation layer along one or more vertical side walls of the plurality of gate trenches, and wherein the insulation layer along the vertical side walls of the plurality of gate trenches is thicker in a region closer to the plurality of intersection regions than in a region distant from the plurality of intersection regions.

2. The semiconductor device according to claim 1, wherein the insulation layer along at least one vertical side wall of at least one of the plurality gate trenches comprises two or more different thicknesses.

3. The semiconductor device according to claim 1, wherein the insulation layer along one vertical side wall of at least one gate trench comprises two or more different thickness and the insulation layer along another vertical side wall of the said at least one gate trench comprises a substantially constant thickness.

4. The semiconductor device according to claim 1, wherein the device has an absence of a busbar, such that a top surface of an active area of the device comprises a continuous, planar surface.

5. The semiconductor device according to claim 1, wherein the device further comprises at least one auxiliary trench extending from a surface into the drift region, wherein the at least one auxiliary trench is laterally spaced from the plurality of gate trenches in the first dimension, and wherein the at least one auxiliary trench extends in the third dimension of the device.

6. The semiconductor device according to claim 5, wherein the at least one auxiliary trench comprises:

two vertical side walls and a bottom surface between the two vertical side walls; and an insulation layer along the vertical side walls and the bottom surface, wherein the insulation layer along one or more vertical side walls of the at least one auxiliary trench is thicker than an insulation layer along one or more vertical side walls of the plurality of gate trenches.

7. The semiconductor device according to claim 1, wherein the device further comprises a conductive layer on an upper surface of the secondary trench.

8. A method of manufacturing a gate controlled semiconductor device, the method comprising:

forming a collector region of a first conductor type;

forming a drift region of a second conductivity type located over the collector region;

forming a body region of a first conductivity type located over the drift region;

forming a first contact region of a second conductivity type located above the body region and having a higher doping concentration compared to the body region;

forming a plurality of gate trenches extending from a surface into the drift region, wherein the at least one first contact region adjoins a gate trench such that, in use, a channel region is formed along said gate trench and within the body region, and wherein the plurality of gate trenches are laterally spaced from each other in a first dimension, and wherein current flows in a second dimension substantially transverse to the first dimension, and wherein the plurality of gate trenches each extend in a third dimension of the device; and forming a secondary trench extending from the surface into the drift region, wherein the secondary trench extends in the first dimension of the device, and wherein the secondary trench contacts each gate trench of the plurality of gate trenches at a plurality of intersection regions laterally spaced along the secondary trench wherein the plurality of gate trenches each comprise:

two vertical side walls and a bottom surface between the two vertical side walls; and an insulation layer along the vertical side walls and the bottom surface;

wherein the secondary trench comprises:

two vertical side walls and a bottom surface between the two vertical side walls; and an insulation layer along the vertical side walls and the bottom surface;

wherein the insulation layer along one or more vertical side walls of the secondary trench is thicker than the insulation layer along one or more vertical side walls of the plurality of gate trenches, and wherein the insulation layer along the vertical side walls of the plurality of gate trenches is thicker in a region closer to the plurality of intersection regions than in a region distant from the plurality of intersection regions.

9. A method according to claim 8, wherein the plurality of gate trenches and the secondary trench are manufactured using the steps of:

performing an etching process to form the plurality of gate trenches and the secondary trench;

forming a first insulation layer on a lower surface and side walls of the gate trenches and the secondary trench;

depositing a hydrophilic layer over the thick insulation layer;

depositing a photoresist material in the one or more trenches, wherein depositing a photoresist material comprises exposing the hydrophilic layer on an upper region of a first side wall of the gate trenches;

performing a wet etch process to etch the insulation layer on the first side wall of the gate trenches to a predetermined distance below the surface of the photoresist material;

removing the photoresist material;

removing the hydrophilic layer; and wherein after the steps of performing the wet etch process, removing the photoresist material, and removing the hydrophilic layer, the method further comprises forming a second insulation layer on the first side wall of the gate trenches, wherein the first insulation layer is thicker than the second insulation layer.

10. A method according to claim 9, wherein the method further comprises depositing a filling material after forming the second insulation layer.

11. A method according to claim 10, wherein the method further comprises depositing a silicide layer over the secondary trench after depositing the filling material.

12. A method according to claim 9, wherein the method comprises manufacturing one or more gate trenches with an asymmetric insulation layer.

13. A method according to claim 9, wherein the method comprises manufacturing one or more gate trenches with a symmetric insulation layer, and wherein depositing a photoresist material comprises exposing the hydrophilic layer on an upper region of two sides of the one or more gate trenches, and wherein the method further comprises:

performing a wet etch process to etch the insulation layer on two side walls of the gate trenches to a predetermined distance below a surface of the photoresist material; and growing the first insulation layer on the two side walls of the gate trenches.

14. A method according to claim 9, wherein the method comprises manufacturing at least two gate trenches each with an insulation layer, wherein a first trench of the at least two gate trenches is separated from a second trench of the at least two gate trenches by a mesa region between the first and second trenches; and wherein depositing a photoresist material comprises exposing the hydrophilic layer in the mesa region between the first and second trenches.

* * * * *